United States Patent
Lee et al.

(10) Patent No.: US 11,121,698 B2
(45) Date of Patent: Sep. 14, 2021

(54) QUARTZ OSCILLATING PLATE

(71) Applicant: TXC CORPORATION, Taipei (TW)

(72) Inventors: Yen-Chih Lee, Ping Cheng (TW); Cheng-Hsun Chung, Ping Cheng (TW); Chih-Hung Chiu, Ping Cheng (TW); Min-Ho Wang, Ping Cheng (TW)

(73) Assignee: TXC Corporation, Taipei (TW)

( * ) Notice: Subject to any disclaimer, the term of this patent is extended or adjusted under 35 U.S.C. 154(b) by 450 days.

(21) Appl. No.: 16/170,409

(22) Filed: Oct. 25, 2018

(65) Prior Publication Data

US 2019/0245511 A1  Aug. 8, 2019

(30) Foreign Application Priority Data

Feb. 5, 2018 (TW) .................. 107103962

(51) Int. Cl.
*H03H 9/19* (2006.01)
*H03H 9/13* (2006.01)
*H03H 9/05* (2006.01)
*H03H 9/02* (2006.01)

(52) U.S. Cl.
CPC .......... *H03H 9/19* (2013.01); *H03H 9/02023* (2013.01); *H03H 9/0514* (2013.01); *H03H 9/13* (2013.01)

(58) Field of Classification Search
CPC .......... H03H 9/13; H03H 9/19; H03H 9/0514; H03H 9/02023
See application file for complete search history.

(56) References Cited

U.S. PATENT DOCUMENTS

| | | | |
|---|---|---|---|
| 2012/0118852 A1 | 5/2012 | Kawashima | |
| 2015/0303896 A1* | 10/2015 | Lim | H03H 9/19 310/361 |
| 2017/0070207 A1* | 3/2017 | Shimao | H03H 9/02023 |
| 2018/0114893 A1* | 4/2018 | Sato | H01L 41/0533 |

\* cited by examiner

*Primary Examiner* — Jeffrey M Shin
(74) *Attorney, Agent, or Firm* — Rosenberg, Klein & Lee

(57) ABSTRACT

A quartz oscillating plate comprises a substrate having a notch. Two sides of the notch respectively have a first side-electrode and a second side-electrode. The first side-electrode receives an external signal. The external signal is transmitted along the perimeter of the substrate. The notch of the substrate can increase the length of the transmission path of oscillation energy. The present invention can improve the Q value of the quartz oscillator using the quartz oscillating plate and optimize the performance of the products using the quartz oscillator.

6 Claims, 8 Drawing Sheets

QUARTZ OSCILLATING PLATE

This application claims priority for Taiwan patent application no. 107103962 filed on Feb. 5, 2018, the content of which is incorporated by reference in its entirety.

BACKGROUND OF THE INVENTION

Field of the Invention

The present invention relates to a quartz oscillating plate, particularly to a quartz oscillating plate having a notch.

Description of the Related Art

Cutting is one of the methods to fabricate quartz oscillating plates. For example, the AT-cut method is used to fabricate the quartz oscillating plate working at given range of temperature and generating a primary vibration. Quartz crystals may be cut into quartz oscillating plates in a mechanical method or a photolithographic method. However, the fabrication of quartz oscillating plates is not limited to use the abovementioned two methods. Other etching methods may also be used to shape quartz crystals and produce quartz oscillating plates having different structures.

Based on the piezoelectric effect, a quartz oscillating plate can generate oscillation with a specified frequency at high accuracy and thus can function as a passive element. In addition to quartz oscillating plates, ceramic oscillating plates were also developed later. However, the accuracy of ceramic oscillating plates is much lower than that of quartz oscillating plates.

Many conventional technologies have been developed to improve the Q value or crystal impedance (CI) of quartz oscillating plates. Some of the conventional technologies improve the structures or fabrication methods to achieve the abovementioned objectives, e.g. forming an inclined plane or a protrudent plane in a quartz oscillating plate or modifying the intersection angle, such as forming a tilt angle of 90, 63, or 35 degrees, so as to inhibit the shearing vibration generated by the primary vibration in the thickness direction. Some of the conventional technologies deal with the distance between the protrudent platform and the platform electrode. Some of the conventional technologies are stressed on cutting a quartz crystal to generate a quartz oscillating plate having special dimensions. Some of the conventional technologies cut a quartz crystal into a stepped quartz oscillating plate so as to increase the energy of the primary vibration. Some of the conventional technologies use a chemical etching method or a mechanical method to generate stepped quartz oscillating plates. Some of the conventional technologies study the influence of the thicknesses of the stepped structure on the vibration. In fact, there are still many other prior arts of quartz oscillating plates, which are too numerous to be described herein.

The applicant of the present invention is an innovator in the field, having undertaken many experiments to improve the structures of quartz oscillating plates, and thus proposing the quartz oscillating plate of the present invention. Compared with the conventional quartz oscillating plates, the present invention has better performance in operation and higher competitiveness in market.

SUMMARY OF THE INVENTION

The primary objective of the present invention is to provide a quartz oscillating plate, wherein a notch structure is used to increase the length of the signal transmission path and improve the Q value, whereby the present invention can significantly increase the Q value of the quartz oscillating plate and is obviously different from the conventional notch-free quartz oscillating plates.

Another objective of the present invention is to provide a quartz oscillating plate, which makes use of the characteristics of quartz to generate a quartz oscillating plate having small volume and low cost and able to operate accurately and stably in frequency control.

In order to achieve the abovementioned objectives, the present invention proposes a quartz oscillating plate, which comprises a substrate. The substrate includes a notch on a lateral side thereof, a first side-electrode, and a second side-electrode, which are respectively on two sides of the notch. An external signal is received by the first side-electrode and transmitted along the substrate. The notch of the substrate can increase the length of the transmission path of the oscillation energy.

In one embodiment, the substrate further includes a first protrudent platform and a first connection member. The first protrudent platform is disposed on the substrate and has a first surface electrode. The first connection member is disposed on the substrate, connected with the first side-electrode and the first protrudent platform, and transmitting an external signal from the first side-electrode to the substrate and the first protrudent platform.

In one embodiment, the substrate further includes a third side-electrode, a fourth side-electrode, a second protrudent platform and a second connection member. The third side-electrode and the fourth side-electrode are disposed on the bottom of the substrate respectively corresponding to the first side-electrode and the second side-electrode. The fourth side-electrode also receives an external signal. The second protrudent platform is disposed on the bottom of the substrate corresponding to the first protrudent platform. The bottom of the second protrudent platform has a second surface electrode. The second connection member is disposed on the bottom of the substrate, connected with the fourth side-electrode and the second protrudent platform, and transmitting the external signal from the fourth side-electrode to the substrate and the second protrudent platform. The notch of the substrate can increase the length of the transmission path of the external signal.

In one embodiment, the notch includes a first inner side, a second inner side, and a third inner side. The external signal is transmitted along the first inner side, the second inner side, and the third inner side. A first included angle is between the first inner side and the second inner side. A second included angle is between the second inner side and the third inner side.

In one embodiment, the first included is equal to or unequal to the second included angle.

In one embodiment, the first included angle is equal to or greater than 90 degrees and is smaller than 160 degrees; the second included angle is equal to or greater than 90 degrees and is smaller than 160 degrees.

In one embodiment, a photolithographic technology and an etching technology are used to fabricate the notch.

In one embodiment, the depth of the notch is 10-160 μm.

In one embodiment, the quartz oscillating plate of the present invention further comprises two electric-conduction bumps respectively disposed below the first side-electrode and the second side-electrode of the substrate.

In one embodiment, the external signal is an alternating-current signal.

Below, embodiments are described in detail in cooperation with the attached drawings to make easily understood the objectives, technical contents, characteristics and accomplishments of the present invention.

DETAILED DESCRIPTION OF THE INVENTION

The present invention modifies the structure of a quartz oscillating plate to increase the length of the transmission path of oscillating energy and vary the crystal impedance, whereby to make the Q value of the oscillating quartz plate of the present invention significantly higher than that of the conventional quartz oscillating plate and optimize the performance of the products using the present invention.

Figure 1:
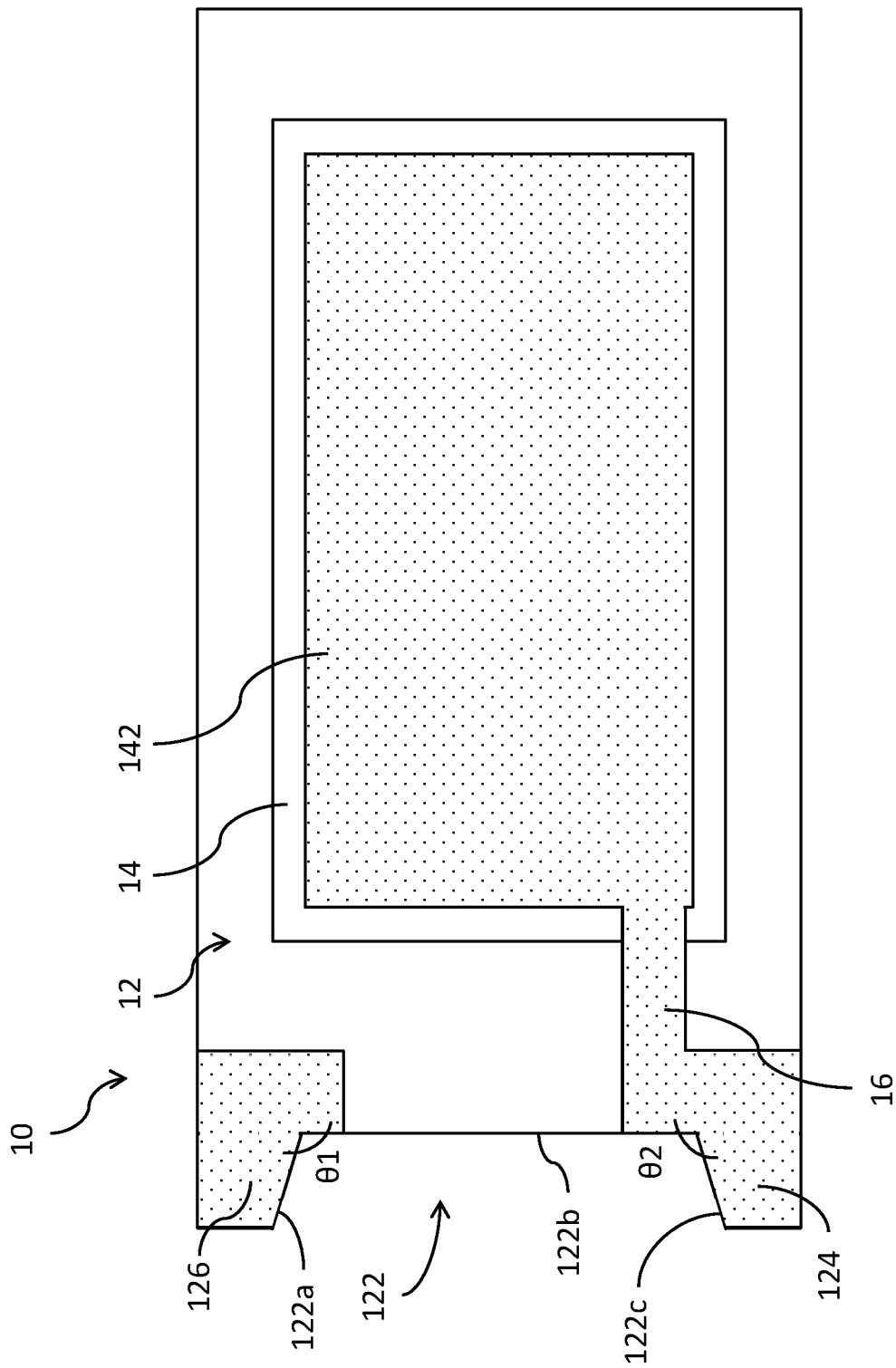
FIG. 1 is a top view schematically showing a quartz oscillating plate according to one embodiment of the present invention.
Figure 2:
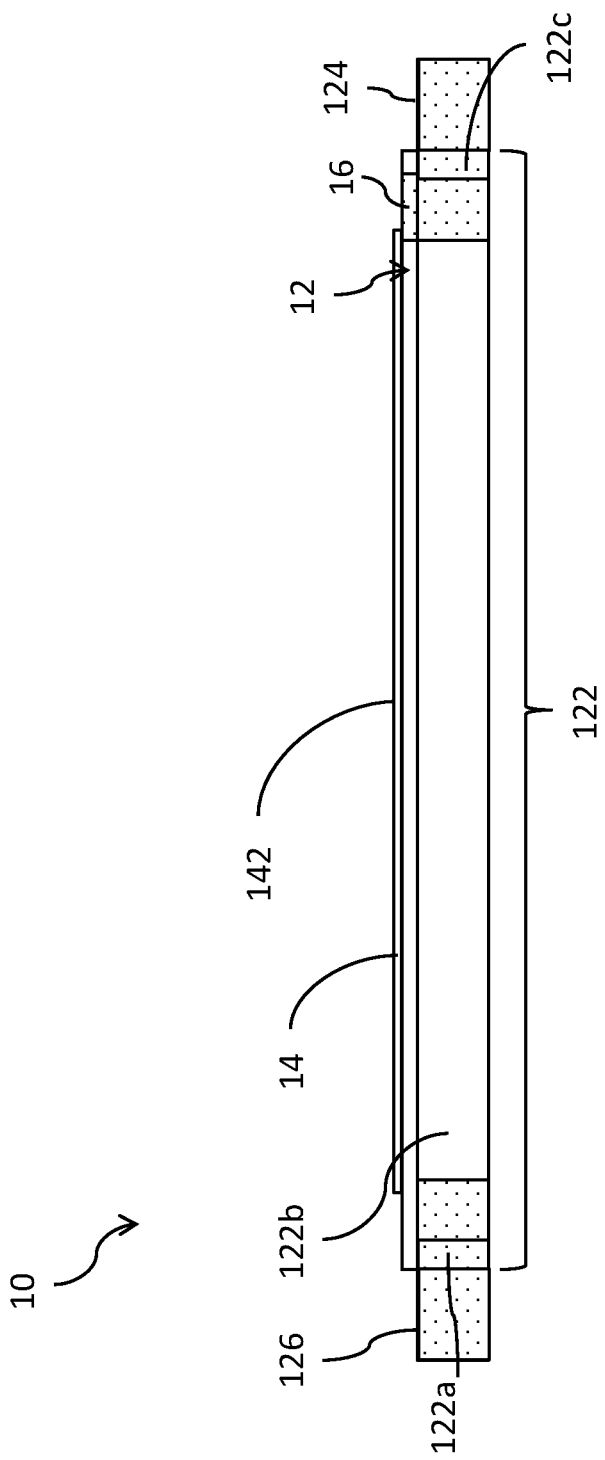
FIG. 2 is a side view facing a notch for schematically showing a quartz oscillating plate according to one embodiment of the present invention.

Refer to FIG. 1 and FIG. 2. The present invention proposes a quartz oscillating plate 10, which comprises a substrate 12, a first protrudent platform 14, and a first connection member 16. The substrate 12, the first protrudent platform 14, and the first connection member 16 are all made of quartz. The present invention does not limit the way how to fabricate the first protrudent platform 14 and the first connection member 16 on the substrate 12. The substrate 12 includes a notch 122 on a lateral side thereof, a first side-electrode 124, and a second side-electrode 126, which are respectively on two sides of the notch 122. The first protrudent platform 14 is formed on the substrate 12. The first protrudent platform 14 has a first surface electrode 142. The first connection member 16 is formed on the substrate 12. The first connection member 16 is connected with the first side-electrode 124 and the first protrudent platform 14. The characteristic of quartz enables the electric connection of the first side-electrode 124 and the first protrudent platform 14 through the first connection member 16. The abovementioned design of the first protrudent platform 14 and the connection member 16 of the substrate 12 is only an embodiment to exemplify the present invention. The present invention does not particularly limit the design of the shape and structure of the substrate 12.

Figure 3:
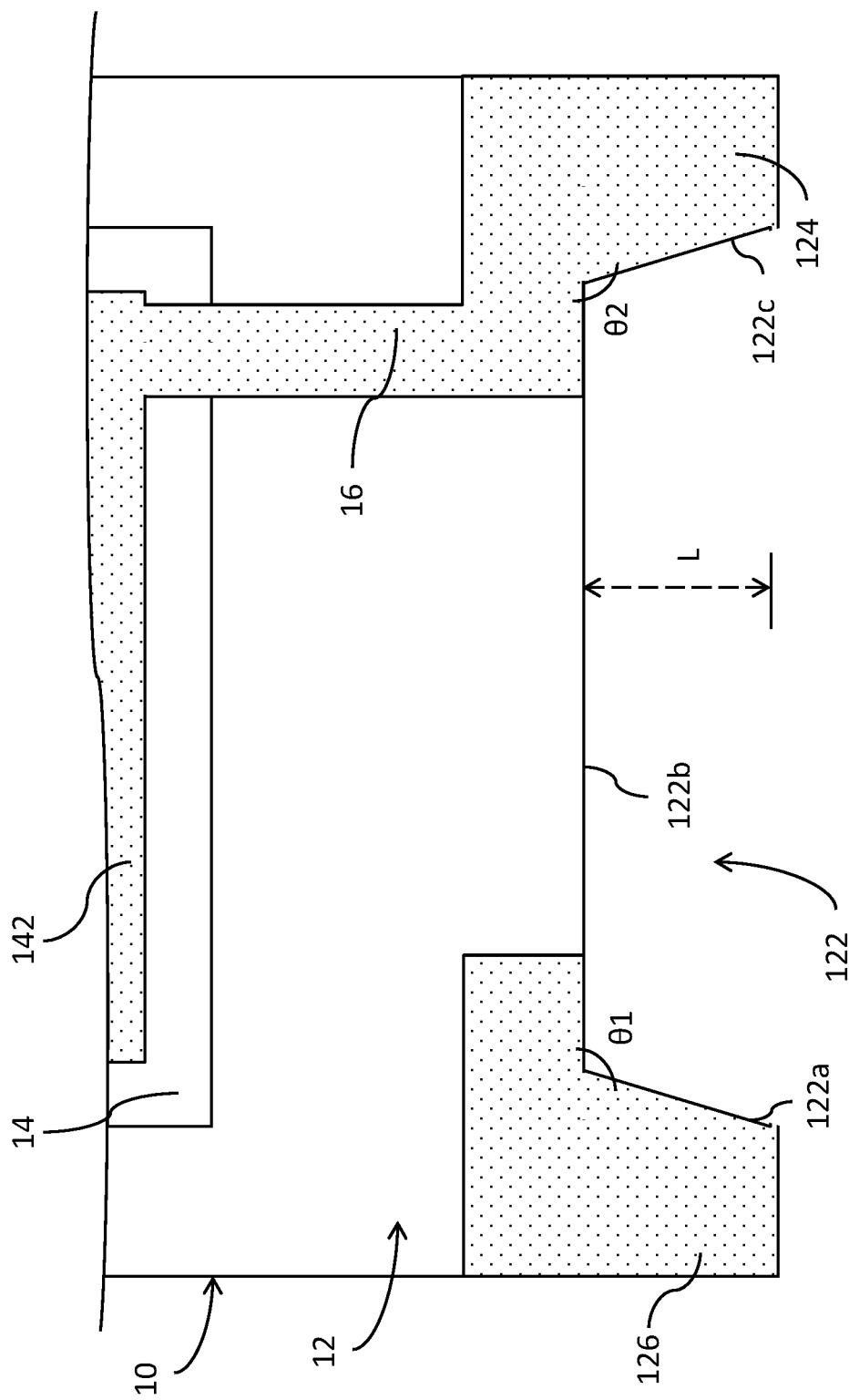
FIG. 3 is a diagram schematically showing a notch of a substrate of a quartz oscillating plate according to one embodiment of the present invention.

Refer to FIG. 3. Below is described in detail the characteristics of the notch 122 of the substrate 12. The notch 12 also includes a first inner side 122a, a second inner side 122b and a third inner side 122c. A first included angle θ1 is between the first inner side 122a and the second inner side 122b. A second included angle θ2 is between the second inner side 122b and the third inner side 122c. The present invention does not limit that the first included angle θ1 must be equal to the second included angle θ2. In the embodiment shown in FIG. 3, the first included angle θ1 is equal to the second included angle θ2. In the present invention, the first included angle θ1 is equal to or greater than 90 degrees and is smaller than 160 degrees; the second included angle θ2 is equal to or greater than 90 degrees and is smaller than 160 degrees. The vertical distance between the second inner side 122b and the edge of the substrate 12, i.e. the depth L of the notch 122, is 10-160 μm. The present invention does not particularly limit the degree of the first included angle θ1, the degree of the second included angle θ2, and the depth L of the notch 122. These values will vary with the size or fabrication process of a quartz oscillating plate. The user may select appropriate values from the abovementioned ranges according to requirement.

Figure 4:
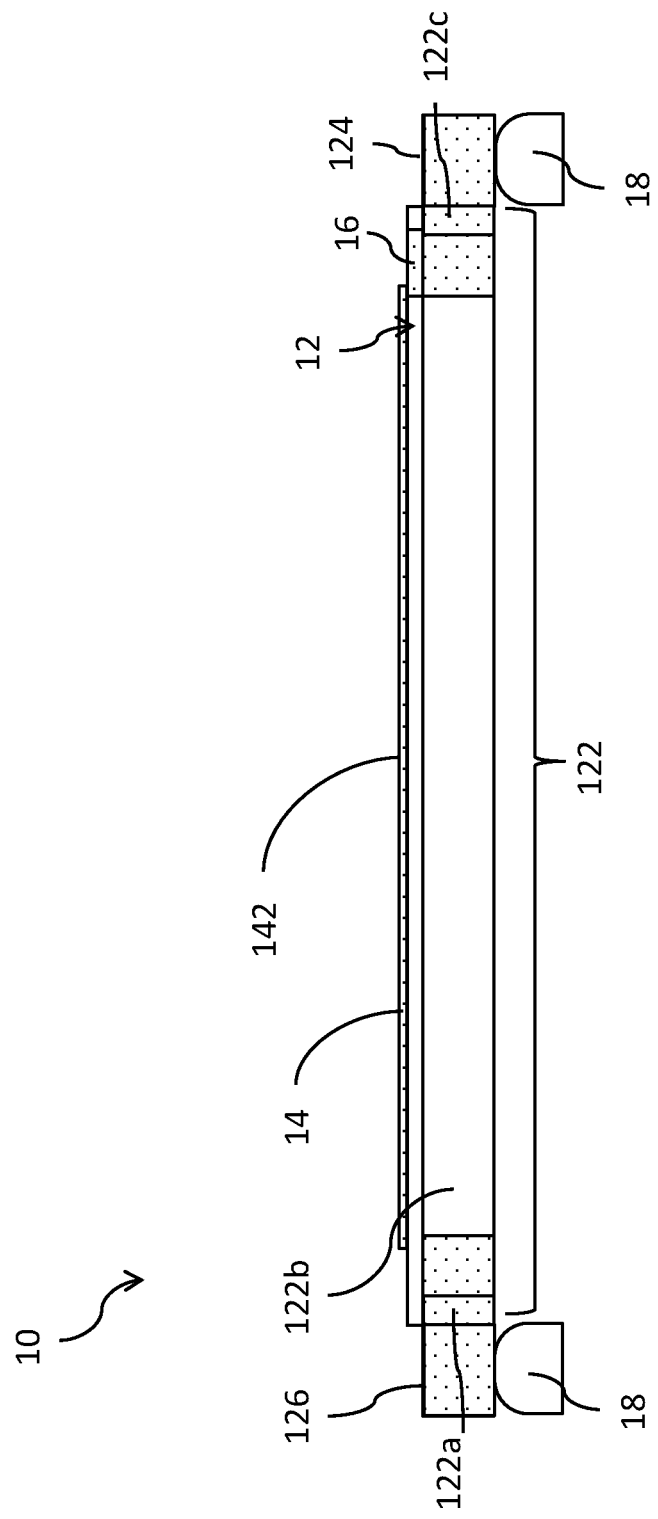
FIG. 4 is a diagram schematically showing that a quartz oscillating plate is disposed on electric-conduction bumps according to one embodiment of the present invention.

After the structure of the oscillating plate of the present invention has been described above, the operation of the present invention will be described in detail below. Refer to FIG. 4, and also refer to FIG. 1 again. The quartz oscillating plate 10 is installed in the package structure thereof (not shown in the drawing) through two electric-conduction bumps 18. The two electric-conduction bumps 18 are respectively disposed below the first side-electrode 124 and the second side-electrode 126, mainly to facilitate the electric conduction of the chip (not shown in the drawing) of the whole package structure of the quartz oscillating plate 10, whereby the quartz oscillating plate 10 can provide a stable oscillation frequency. In the present invention, an external signal, such as an external alternating-current signal, is received by the first side-electrode 124 and transmitted to the first protrudent platform 14 and the first surface electrode 142 through the first connection member 16. The external signal induces vibration to generate oscillation energy. The oscillation energy may be transmitted along the perimeter of the first protrudent platform 14. While transmitted to the notch 122 of the substrate 12, the oscillation energy may be transmitted along the first inner side 122a, the second inner side 122b and the third inner side 122c of the notch 122. Thus is increased the length of the transmission path and the transmission time of the oscillation energy.

Figure 5:
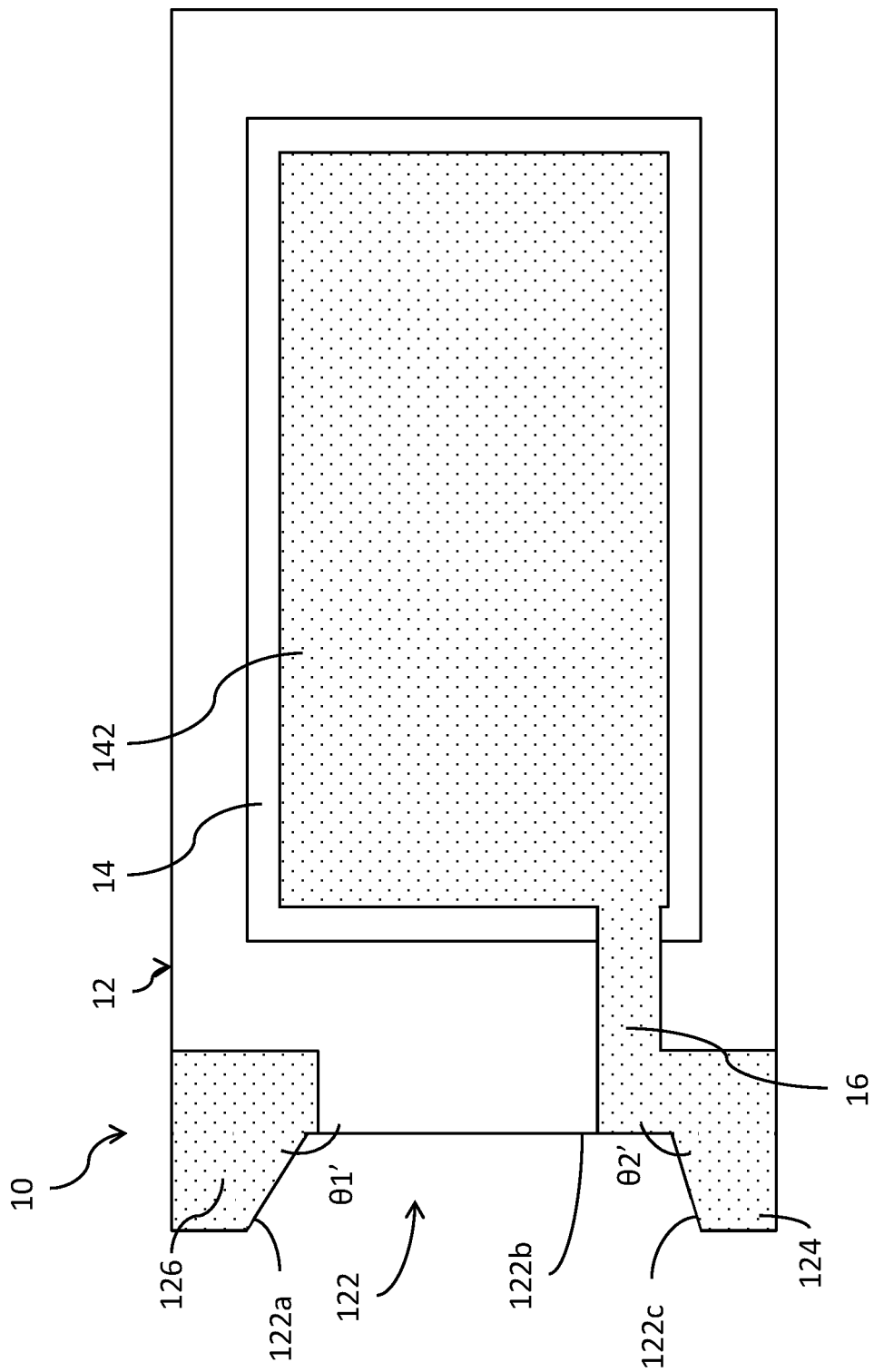
FIG. 5 is a diagram schematically showing that a first included angle is larger than a second included angle according to one embodiment of the present invention.
Figure 6:
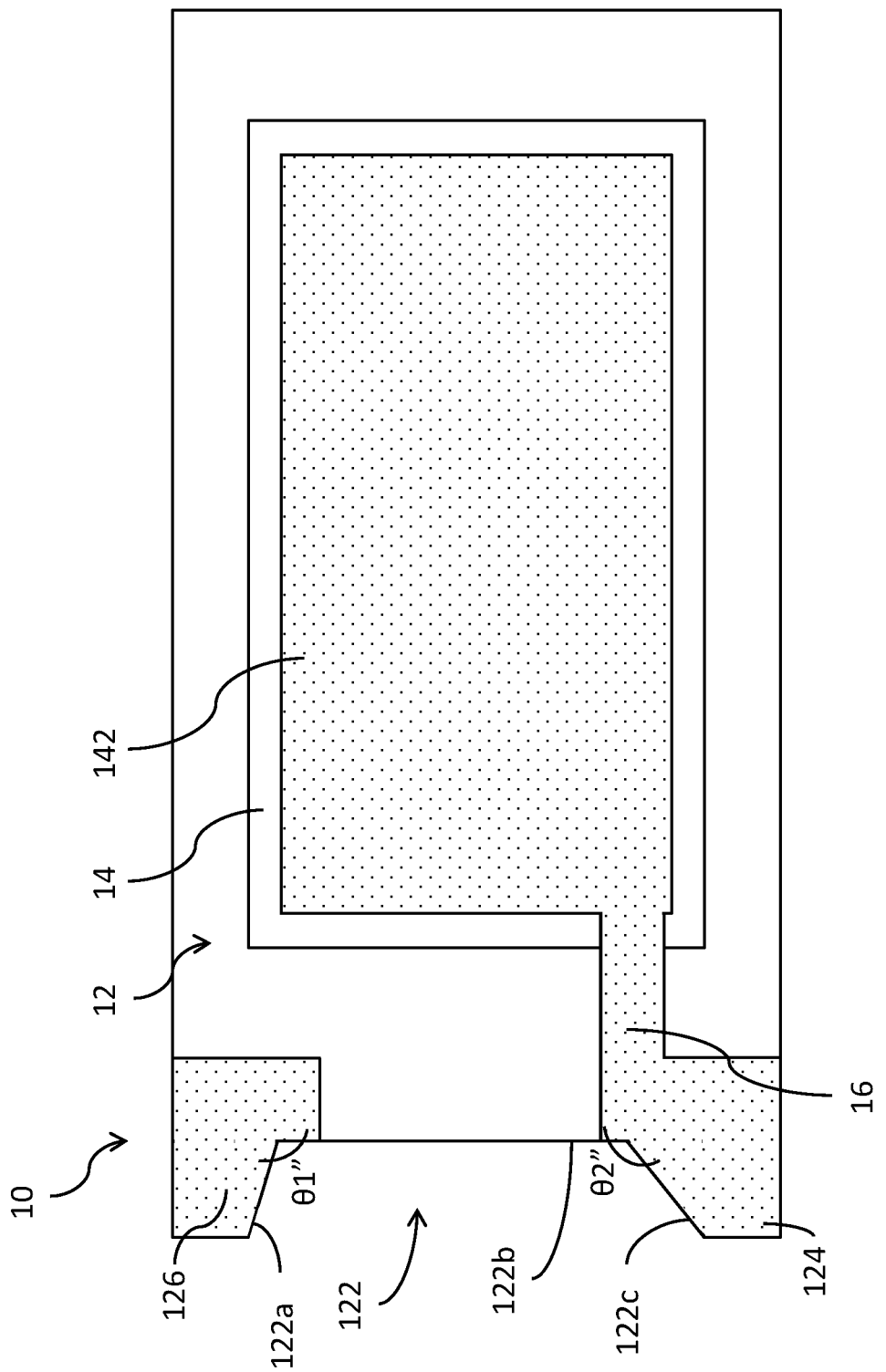
FIG. 6 is a diagram schematically showing that a second included angle is larger than a first included angle according to one embodiment of the present invention.

In the abovementioned embodiments, the degrees of the first included angle are equal to the degrees of the second included angle. Refer to FIG. 5 and FIG. 6 for other embodiments of the present invention. In FIG. 5, the first included angle θ1' is larger than the second included angle θ2'. In FIG. 6, the first included angle θ1" is smaller than the second included angle θ2". Therefore, the first included angle is not necessarily equal to the second included angle but may be larger or smaller than the second included angle. In the present invention, the relationship of the values of the first included angle and the second angle is dependent on the requirement of the designer.

Figure 7:
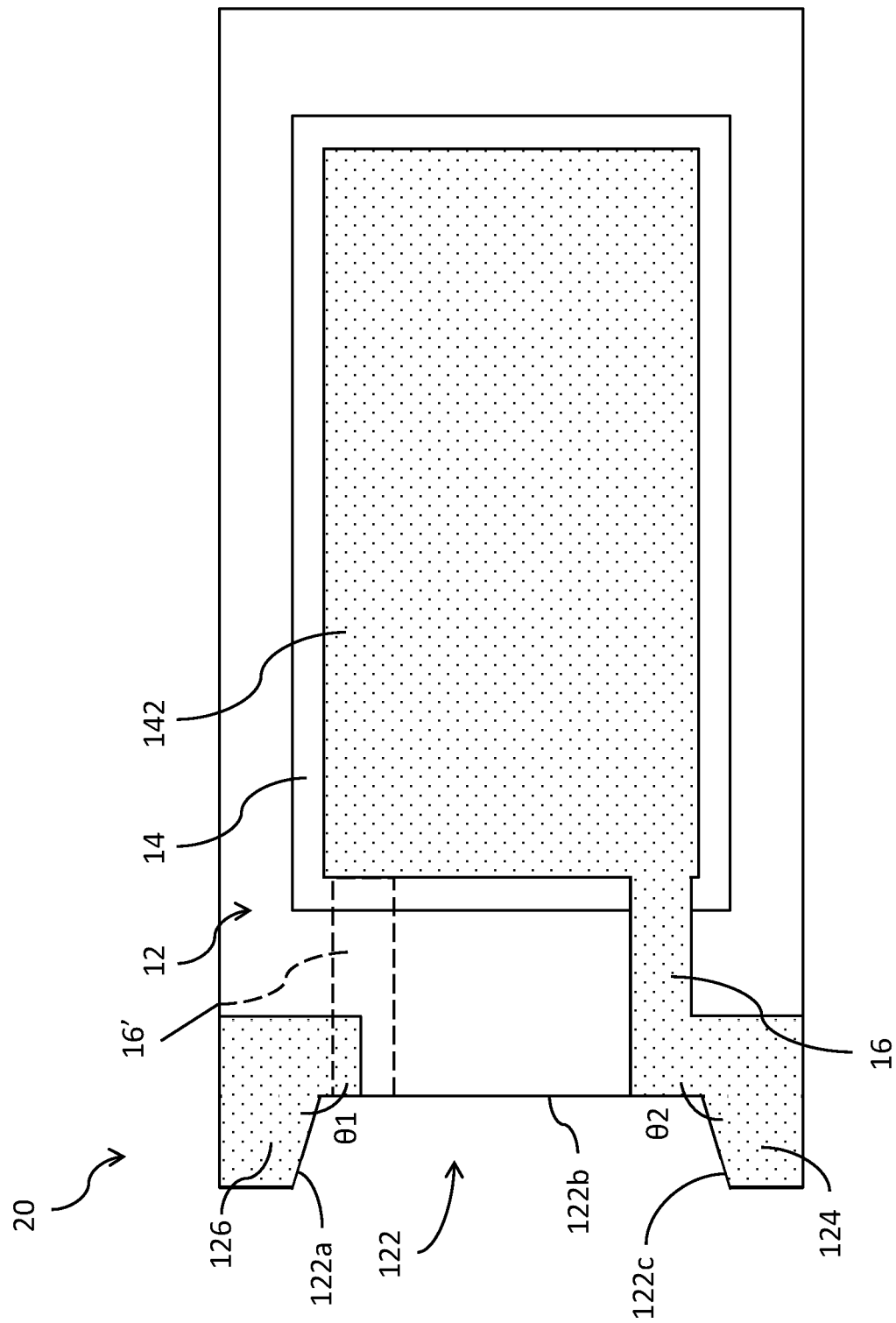
FIG. 7 is a diagram schematically showing a double-side quartz oscillating plate according to one embodiment of the present invention.
Figure 8:
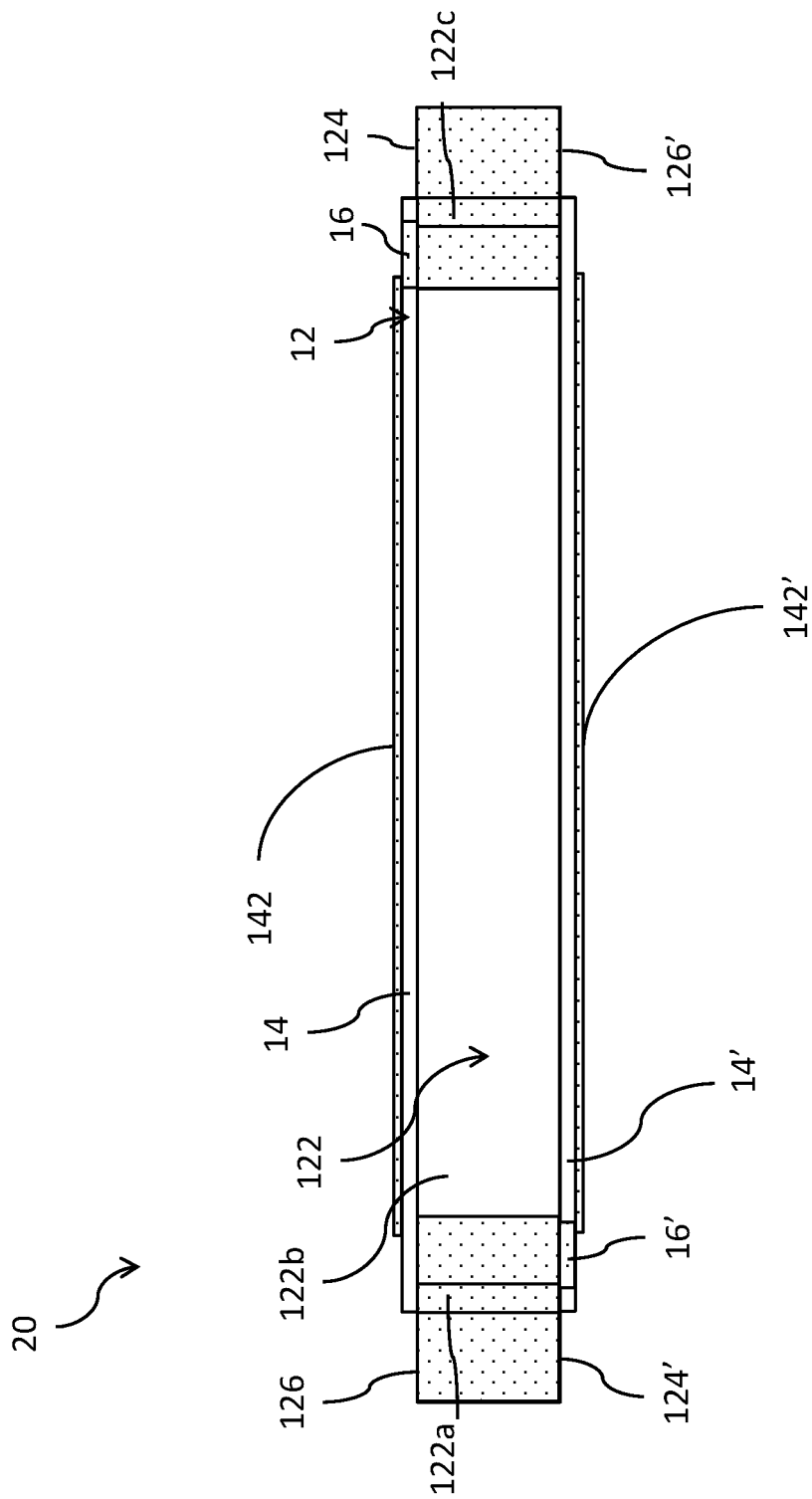
FIG. 8 is a side view facing a notch for schematically showing a double-side quartz oscillating plate according to one embodiment of the present invention.

Refer to FIG. 7 and FIG. 8. In one embodiment, a structure the same as the first protrudent platform 14 is formed on the other surface opposite to the first protrudent platform 14. In other words, the first side-electrode 124, the second side-electrode 126 and the first protrudent platform 14 are rotated by 180 degrees and formed on the bottom of the substrate 12. In this embodiment, the third side-electrode 126' and the fourth side-electrode 124' are respectively corresponding to the first side-electrode 124 and the second side-electrode 126. The fourth side-electrode 124' may receive an external signal. A second protrudent platform 14' is formed on the bottom of the substrate 12 and corresponding to the first protrudent platform 14. A second surface electrode 142' is formed on the second protrudent platform 14'. A second connection member 16' is formed on the bottom of the substrate 12. The second connection member 16' is connected with the fourth side-electrode 124' and the second protrudent platform 14'. An external signal is received by the fourth side-electrode 124' and transmitted to the substrate 12 and the second protrudent platform 14' through the second connection member 16'. The notch 122 of the substrate 12 can increase the length of the transmission path of the external signal. Thereby is formed a double-side quartz oscillating plate 20. The present invention does not limit the way of fabricating the double-side quartz oscillating plate 20. In the present invention, the double-side quartz oscillating plate 20 may be fabricated via shaping a single quartz crystal or joining different structures. In the embodiment, the first connection member 16 and the second connection member 16' are diagonally opposite to each other. In the double-side quartz oscillating plate 20, the first side-electrode 124 and the first connection member 16 are above the third side-electrode 126'; the fourth side-electrode 124' and the second connection member 16' are below the second side-electrode 126. The other structures, the way that the external signal is transmitted, and the way that the oscillation energy is conducted through the notch of the double-side quartz oscillating plate 20 are the same as those of the single-side quartz oscillating plate described above and will not repeat herein.

The present invention varies the structure of a quartz oscillating plate to increase the length of the transmission path of the oscillation energy in the quartz oscillating plate. For example, a photolithography technology and an etching technology of the semiconductor process are used to shape the substrate and form a notch on the lateral side near the side-electrodes to increase the length of the transmission path of the oscillation energy in the quartz oscillating plate and improve the Q value of the quartz oscillating plate. The quartz oscillating plate of the present invention can achieve a Q value of 50.5 (k), which is significantly higher than the Q value of 21.5 (k) the ordinary quartz oscillating plate can achieve. Therefore, the present invention can improve the performance of the products using the present invention.

The embodiments described above are to demonstrate the technical thoughts and characteristics and of the present invention and enable the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A quartz oscillating plate comprising a substrate, a first side-electrode, a second side-electrode, a first surface electrode, and a first connection member, wherein said substrate has a notch along a lateral side of said substrate; said first and second side-electrodes are respectively disposed at two corners of a top side of said substrate with said notch sandwiched in between; said first surface electrode is disposed on said top side besides said first side-electrode, said notch, and said second side-electrode; said first connection member is disposed on said top side connecting said first surface electrode and said first side-electrode;

wherein said notch is surrounded by a first inner side, a third inner side opposing said first inner side, and a second inner side between said first and third inner sides; said notch defining a length of a transmission path which includes a summation of lengths of said first, said second, and said third inner sides, a first included angle between said first inner side and said second inner side is greater than 90 degrees and is smaller than 160 degrees; a second included angle between said second inner side and said third inner side is greater than 90 degrees and is smaller than 160 degrees;

wherein said notch has a depth of 10-160 μm corresponding to the first included angle and the second included angle;

whereby said transmission path is selectively chosen as a function of the lengths of said first inner side, second inner side and third inner side and said first and second included angles.

2. The quartz oscillating plate according to claim 1, further comprising
 a first protrudent platform disposed on said top side of said substrate;
 wherein said first surface electrode is disposed on a top side of the said first protrudent platform.

3. The quartz oscillating plate according to claim 1, further comprising
 a third side-electrode and a fourth side-electrode respectively disposed at two corners of a bottom side of said substrate with said notch sandwiched in between and respectively corresponding to said first side-electrode and said second side-electrode;
 a second surface electrode disposed on said bottom side besides said third side-electrode, said notch, and said fourth side-electrode and corresponding to said first surface electrode; and
 a second connection member disposed on said bottom side connecting said second surface electrode and said fourth side-electrode.

4. The quartz oscillating plate according to claim 3, further comprising
 a second protrudent platform disposed on said bottom side of said substrate;
 wherein said second surface electrode is disposed on a bottom side of the said second protrudent platform.

5. The quartz oscillating plate according to claim 1, wherein said first included angle is equal to said second included angle.

6. The quartz oscillating plate according to claim 1, further comprising two electric-conduction bumps respectively disposed beneath said substrate below said first side-electrode and said second side-electrode.

* * * * *